(12) United States Patent
Li et al.

(10) Patent No.: US 7,235,342 B2
(45) Date of Patent: Jun. 26, 2007

(54) NEGATIVE PHOTORESIST COMPOSITION INCLUDING NON-CROSSLINKING CHEMISTRY

(75) Inventors: Wenjie Li, Poughkeepsie, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 10/766,058

(22) Filed: Jan. 28, 2004

(65) Prior Publication Data

US 2005/0164507 A1    Jul. 28, 2005

(51) Int. Cl.
*G03F 7/038* (2006.01)
*G03F 7/30* (2006.01)

(52) U.S. Cl. .................. 430/270.1; 430/323; 430/325; 430/905; 430/910; 430/914; 430/927

(58) Field of Classification Search ............. 430/270.1, 430/323, 325, 905, 910, 914, 927
See application file for complete search history.

(56) References Cited

U.S. PATENT DOCUMENTS

| | | | |
|---|---|---|---|
| 4,855,017 A | 8/1989 | Douglas | |
| 5,362,663 A | 11/1994 | Bronner et al. | |
| 5,429,710 A | 7/1995 | Akiba et al. | |
| 5,468,819 A | 11/1995 | Goodall et al. | |
| 5,562,801 A | 10/1996 | Nulty | |
| 5,618,751 A | 4/1997 | Golden et al. | |
| 5,705,503 A | 1/1998 | Goodall et al. | |
| 5,744,376 A | 4/1998 | Chan et al. | |
| 5,801,094 A | 9/1998 | Yew et al. | |
| 5,821,169 A | 10/1998 | Nguyen et al. | |
| 5,843,624 A | 12/1998 | Houlihan et al. | |
| 6,048,664 A | 4/2000 | Houlihan et al. | |
| 7,011,923 B2 * | 3/2006 | Li et al. | .................. 430/270.1 |
| 7,081,326 B2 * | 7/2006 | Li et al. | .................. 430/270.1 |

FOREIGN PATENT DOCUMENTS

JP    2000-63433    *    2/2000

* cited by examiner

Primary Examiner—Richard L. Schilling
(74) Attorney, Agent, or Firm—Schmeiser, Olsen & Watts; Steven Capella (57) ABSTRACT

A negative photoresist composition and a method of patterning a substrate through use of the negative photoresist composition. The composition includes: a radiation sensitive acid generator; a hydroxy-containing additive; and a resist polymer derived from at least one first monomer. The resist polymer may be further derived from a second monomer having an aqueous base soluble moiety. The hydroxy-containing additive has the structure of Q—OH, where Q may include one or more cyclic structures. Q—OH may have a primary alcohol structure. The acid generator is adapted to generate an acid upon exposure to radiation. The resist polymer is adapted to chemically react with the additive in the presence of the acid to generate a non-crosslinking reaction product that is insoluble in an aqueous alkaline developer solution.

30 Claims, 3 Drawing Sheets

NEGATIVE PHOTORESIST COMPOSITION INCLUDING NON-CROSSLINKING CHEMISTRY

BACKGROUND OF THE INVENTION

1. Technical Field

The present invention relates to a photoresist composition and, more particularly, to a negative photoresist composition including non-crosslinking chemistry. The invention further relates to a method of patterning a substrate employing the negative resist composition.

2. Related Art

Photolithography is a process of transferring a pattern of geometric shapes on a mask to a substrate such as a silicon wafer. The mask may be a glass plate containing a pattern (e.g., a chromium pattern) of transparent and opaque regions to define the geometrical shapes. Given such a substrate, a layer of photoresist is applied to an exterior surface of the substrate such as by spin coating or the like. There are two types of photoresist: positive photoresist and negative photoresist. Positive resists are insoluble in a developer solution, whereas negative resists are soluble in a developer solution.

For positive resists, the resist is exposed with ultraviolet (UV) light. The UV light is propagated through the mask and onto the substrate, wherever the underlying material is to be removed. In the positive resists, exposure to the UV light changes the chemical structure of the resist so that it becomes soluble in a developer solution. The exposed resist is then selectively washed away by the developer solution, leaving isolated regions of the unexposed resist. The mask, therefore, contains an exact copy of the geometric pattern which is to remain on the substrate.

Negative resists behave in the opposite manner. As is known in the art, exposure to the UV light initiates a cross-linking reaction which causes the negative resist to become polymerized with a consequent significant increase in molecular weight of the reaction product as compared with the molecular weight of the unexposed negative resist. The increase in molecular weight results in the reaction product being insoluble in the developer solution. The cross-linking reaction may be acid catalyzed, and the negative resist may accordingly include an acid generator that generates acid upon exposure to the UV light. Thus, the negative resist remains on the surface of the substrate wherever it is exposed, and the developer solution removes only the unexposed portions. Masks used for negative photoresists, therefore, contain the inverse of the geometric pattern to be transferred.

Traditional negative photoresist compositions characterized by a cross-linking chemistry exhibit disadvantages such as swelling (i.e., expanding in volume) and/or microbridging in photolithographic applications when the exposed photoresist contacts a developer solution or solvent. The swelling and/or microbridging limits the spatial resolution that may be obtained via photolithography. "Microbridging" is said to occur if a continuous strand of photoresist material bridges across a void region in which soluble photoresist has been developed away by a developer solution or solvent, wherein the void region separates two regions of insoluble photoresist material to which the strand of photoresist material is attached.

Therefore, there is a need for negative photoresist compositions that are not subject to swelling and/or microbridging when the exposed photoresist is dissolved in developer solution to avoid limited spatial resolution in photolithographic applications.

SUMMARY OF THE INVENTION

The present invention provides a negative photoresist composition, comprising:
(a) a radiation sensitive acid generator;
(b) a hydroxy-containing additive having the structure:

wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first wherein M is a polymerizable backbone moiety,
wherein Z is a linking moiety comprising one of —C(O)O—, —C(O)—, —OC(O)—, —O—C(O)—C(O)—O—,
wherein Y is one of an alkylene group, an arylene group, a semi- or perfluorinated alkylene group, and a semi- or perfluorinated arylene group,
wherein p is 0 or 1,
wherein q is 0 or 1,
wherein R1, R2, R3, and R4 independently comprise one of hydrogen and a straight or branched alkyl group with 1 to 6 carbons,
wherein the resist polymer is soluble in an aqueous alkaline developer solution,
wherein the acid generator is adapted to generate an acid upon exposure to imaging radiation characterized by a wavelength, and
wherein the resist polymer is adapted to chemically react with the additive in the presence of the acid to generate a product that is insoluble in the developer solution.

The present invention provides method of patterning a substrate, said method comprising the steps of:
(A) applying a negative photoresist composition to the substrate to form a resist layer on a material layer of the substrate and in direct mechanical contact with the material layer, said composition comprising:
(a) a radiation sensitive acid generator;
(b) a hydroxy-containing additive having the structure:

wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene group, a semi- or perfluorinated alkylene group, and a semi- or perfluorinated arylene group, wherein p is 0 or 1, wherein q is 0 or 1 wherein R1, R2, R3, and R4 independently comprise one of hydrogen and a straight or branched alkyl group with 1 to 6 carbons, and wherein the resist polymer is soluble in an aqueous alkaline developer solution;

(B) selectively exposing a first portion of the resist layer to imaging radiation characterized by a wavelength such that a second portion of the resist layer is not exposed to the radiation, wherein the first and second portions of the resist layer form a pattern in the resist layer, wherein the radiation causes the acid generator to generate acid in the first portion of the resist layer, wherein the acid facilitates a chemical reaction between the resist polymer and the additive in the first portion of the resist layer such to generate a reaction product in the first portion of the resist layer, and wherein the reaction product is insoluble in the developer solution; and (C) developing away the second portion of the resist layer by contacting the resist layer with the developer solution such that the second portion of the resist layer is replaced by voids in the resist layer.

The present invention advantageously provides a negative photoresist that is not subject to swelling and/or microbridging in the exposed region when placed in a developer solution after being exposed to imaging radiation.

DETAILED DESCRIPTION OF THE INVENTION

The present invention discloses negative photoresist compositions which may be cured without a crosslinker. A negative photoresist is said to be "cured" when chemically transformed into a reaction product that is insoluble in an aqueous base developer solution. Hereinafter, a "crosslinker" is a chemical additive that may be included in curable photoresist compositions, wherein the crosslinker may bond to reactive side groups on a polymeric backbone of photoresist compositions during their cure, resulting in a crosslinked photoresist that may become insoluble in aqueous base developer solutions. Hereinafter, "non-crosslinking" chemistry means the negative photoresist compositions of the present invention may be cured without use of a crosslinker.

The negative photoresist compositions of the present invention are generally characterized by a non-crosslinking chemistry capable of providing good spatial resolution in lithographic patterns resulting from use of imaging radiation characterized by a wavelength of 193 nm or less (e.g., 157 nm).

The present invention further discloses a method of patterning a substrate (e.g., a semiconductor wafer) though use of said negative photoresist composition.

The negative photoresist compositions of the invention generally comprise:

(a) a radiation sensitive acid generator;

(b) a hydroxy-containing additive having the structure wherein the additive is transparent to the wavelength (e.g., 193 nm, 157 nm, etc.) of the imaging radiation. The additive may have a primary alcohol structure such as, inter alia, a 1-adamantanemethanol, a 1-adamantaneethanol, or a derivative thereof. Q may be a bulky group. Hereinafter, a bulky group is a hydrophobic group such as, inter alia, a hydrocarbon having at least 4 carbons. Q may include one or more cyclic structures. For example, Q may include one or more alicyclic structures. Q may include, inter alia, one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, and an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene group, a semi- or perfluorinated alkylene group, and a semi- or perfluorinated arylene group, wherein p is 0 or 1, wherein q is 0 or 1, and wherein R1, R2, R3, and R4 independently comprise one of hydrogen and a straight or branched alkyl group with 1 to 6 carbons.

In some embodiments, the alkylene group in Y includes from 1 to 10 carbons. In some embodiments, the arylene group in Y includes from 6 to 10 carbons. In some embodiments, the semi- or perfluorinated alkylene group in Y includes from 1 to 10 carbons. In some embodiments, the semi- or perfluorinated arylene group in Y include from 6 to 10 carbons.

Upon exposure of the negative photoresist composition to an imaging radiation characterized by a wavelength, an acid is generated by the acid generator. Prior to the exposure of the photoresist to the imaging radiation, the resist polymer is soluble in an aqueous alkaline developer solution. The generated acid facilitates a non-crosslinking chemical reaction between the resist polymer (2) and the hydroxy-containing additive (1) to generate a reaction product that is insoluble in the developer solution. Thus, the negative photoresist of the present invention will not be subject to the swelling and/or microbridging that often manifests when negative photoresists characterized by traditional crosslinking chemistries are exposed to an aqueous alkaline developer solution after being exposed to imaging radiation. Accordingly, the negative photoresist of the present invention provides good spatial resolution in photolithographic applications with imaging radiation wavelengths of 193 nm or less (e.g., 157 nm). Of course, the negative photoresist of the present invention also provides good spatial resolution in photolithographic applications with imaging radiation wavelengths exceeding 193 nm (e.g., 248 nm).

The following structures (I to XIV) are non-limiting examples of the hydroxy-containing additive (1) which may be used in the negative photoresist composition:

(I)

(II)

(III)

(IV)

(V)

(VI)

(X)

(XI)

(XII)

(XIII)

(XIV)

Note that the wavy bond in structure II has a first end and a second end, wherein the wavy bond is coupled at the first end to a depicted OH group, and wherein the wavy bond is attached to a planar bonding structure at the second end. The wavy bond signifies that the structure II may have either an endo isomer or an exo isomer representation with respect to the planar bonding structure.

The following structures (XV to XXII) are non-limiting examples of first monomers (2) from which the resist polymer may be derived:

(XV)

(XVI)

(XVII)

(XVIII)

(XIX)

(XX)

(XXI)

(XXII)

The resist polymer may comprise a first repeating unit derived from various one or more first monomers in accordance with the structure (2), wherein coupling the first repeating units derived from the one or more of said various first monomers may form a backbone having any sequential order of the repeating units along said backbone. Thus, the resist polymer may include repeating units derived from only a single specific first monomer having the structure (2), or may alternatively include repeating units derived from two or more different first monomers having the structure (2) in any sequential order along the backbone.

Resist polymer XXIII, depicted below, is an example of the former resist polymer described above, having repeating units derived from only a single specific first monomer XV. Structure XXIII consists essentially of repeating units derived from the first monomer XV. The number of repeating units derived from first monomer XV is designated by the positive integer n. Generally, the number of repeating units (n) derived from first monomer is from about 10 to about 200.

(XXIII)

Alternatively, the resist polymer may include repeating units derived from two or more different first monomers, each having the structure (2), in any sequential order along the backbone of the resist polymer. Resist polymer XXIV (i.e., XV-co-XVI), depicted below, is a copolymer of first monomer XV and first monomer XVI. Generally, the number of repeating units (x) and (y) of the first monomers used to form the copolymer may each independently be in a range of about 5 to about 100. Although the structure XXIV depicts a blocked copolymer, the copolymer XV-co-XVI may alternatively be in the form of random copolymer or an alternating copolymer.

(XXIV)

The preceding structures XXIII and XXIV are merely illustrative, and the scope of the resist polymer generally may be derived from one or more first monomers in any ordered sequence of repeating units relating to each such first monomer.

The resist polymer may further comprise a repeating unit derived from a second monomer, wherein the second monomer has an aqueous base soluble moiety. The second monomer may comprise an acidic functionality such as a fluorosulfonamide, a carboxylic acid, or a fluoroalcohol to provide the associated second monomer with said aqueous base soluble moiety.

The following structures (XXV to XXXXV) are non-limiting examples of second monomers from which the resist polymer may be derived:

(XXV)

(XXVI)

-continued

(XXVII)

(XXVIII)

(XXIX)

(XXX)

-continued

(XXXI)

(XXXII)

(XXXIII)

(XXXIV)

(XXXV)

(XXXVI)

(XXXVIII)

(XXXIX)

(XXXX)

(XXXXI)

(XXXXII)

(XXXVII)

-continued (XXXXIII)

(XXXXIV)

(XXXXV)

Note that in the preceding structures XXVI, XXIX, XXXI, XXXVIII, XXXXI, and XXXXIV, the bond from oxygen (O) to a position between two carbons signifies that the O is bonded to either of the two carbons.

The resist polymer derived from various first monomers and second monomers may have a backbone such that repeating units derived said first and second monomers are distributed in any sequential order along the backbone. The resulting resist polymers derived from said first and second monomers are analogous to structure XXIV, discussed supra. The difference is that the resulting resist polymers are derived from both first and second monomers, whereas the structure XXIV was derived only from first monomers (i.e., structures XV and XXVI).

The resist polymer may include any polymerizable backbone moiety M. The choice of M may be made on the basis of ease of polymerization of the first monomers or of the first and second monomers. M may include one of a first structure and a second structure, wherein the first structure is:

wherein $R_5$ represents one of hydrogen, an alkyl group of 1 to 20 carbons, a semi- or perfluorinated alkyl group of 1 to 20 carbons, and CN, wherein the second structure is:

and wherein t is an integer from 0 to 3.

The acid generator in the resist composition may include any radiation-sensitive acid generating structure, or a combination of such radiation-sensitive acid generating structures, that absorbs a significant portion of the imaging radiation at its characteristic wavelength (e.g., at a wavelength of 193 nm or below such as at 157 nm). Thus, the negative photoresist of the present invention is not limited to the use of any specific acid generator or combination of acid generators subject to the aforementioned radiation absorptivity constraint.

In various exemplary embodiments, radiation sensitive acid generators, also known as photoacid generators, may be used in the photoresist composition of the invention. These photoacid generators are compounds that generate an acid upon exposure to radiation. In various exemplary embodiments, any suitable photoacid generating agent may be used, so long as a mixture of the aforementioned photoresist composition of the present invention and the selected photoacid generator dissolve sufficiently in an organic solvent and the resulting solution thereof may form a uniform film by a film-forming process, such as spin coating or the like. As is well known to those skilled in the art after reading the present application, the following illustrative classes of photoacid generators may be employed in various exemplary embodiments of the present invention: onium salts, succinimide derivatives, diazo compounds, nitrobenzyl compounds, and the like. To minimize acid diffusion for high resolution capability, the photoacid generators may be such that they generate bulky acids upon exposure to radiation. Such bulky acids may include at least 4 carbon atoms.

A preferred photoacid generator that may be employed in the present invention is an onium salt, such as an iodonium salt or a sulfonium salt, and/or a succinimide derivative. In various exemplary embodiments of the present invention, examples of the preferred photoacid generator structures for the present invention include, inter alia, at least one of: 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide. Any of the preceding photoacid generators may be used singly or in a mixture of two or more.

The specific photoacid generator selected will depend on the irradiation being used for patterning the photoresist. Photoacid generators are currently available for a variety of different wavelengths of light from the visible range to the X-ray range; thus, imaging of the photoresist can be performed using deep-UV, extreme-UV, e-beam, laser, or any other selected irradiation source that is deemed useful.

As stated above, the negative photoresist composition of the present invention may further comprise a solvent, and other performance enhancing additives; e.g., a quencher.

Solvents well known to those skilled in the art may be employed in the photoresist composition of various exemplary embodiments of the present invention. Such solvents may be used to dissolve the resist polymer, the additive, and other components of the photoresist composition. Illustrative examples of such solvents may include, but are not limited to: ethers, glycol ethers, aromatic hydrocarbons, ketones, esters and the like. Preferred solvents may include propylene glycol monomethyl ether acetate, ethyl lactate, γ-butyrolactone, and cyclohexanone. Any of these solvents may be used singly or in a mixture of two or more.

The quencher that may be used in the photoresist composition of the invention may comprise a weak base that scavenges trace acids, while not having an excessive impact on the performance of the negative photoresist. Illustrative examples of such quenchers may include aromatic or aliphatic amines, such as 2-phenylbenzimidazole, tetraalkyl ammonium hydroxides, such as tetrabutyl ammonium hydroxide (TBAH).

In some embodiments for the negative photoresist composition of the present invention: the weight of the polymer is about 1% to about 30% of the weight of the composition; the weight of the solvent is about 70% to about 99% of the weight of the composition; the weight of the hydroxy-containing additive is about 5% to about 70% of the weight of the polymer; and the weight of the acid generator is about 0.5% to about 20% of the weight of the polymer. The preceding weight percents of the hydroxy-containing additive and the acid generator are relevant if the solvent is present in the composition and are also relevant if the solvent is not present in the composition.

In some embodiments for the negative photoresist composition of the present invention: the weight of the polymer is about 5% to about 15% of the weight of the composition; the weight of the solvent is about 85% to about 95% of the weight of the composition; the weight of the hydroxy-containing additive is about 10% to about 50% of the weight of the polymer; and the weight of the acid generator is about 0.5% to about 10% of the weight of the polymer. The preceding weight percents of the hydroxy-containing additive and the acid generator are relevant if the solvent is present in the composition and are also relevant if the solvent is not present in the composition.

The negative photoresist composition may further comprise a quencher, wherein the weight of the quencher is about 0.1% to about 1.0 wt. % of the weight of the polymer.

If the resist polymer is derived from both first monomers having the structure (2) and second monomers having an aqueous base moiety, then relative molar concentration of the first monomer and the second monomer depends on the specific choices of the first monomer and the second monomer. Due to the variability in extent to which the first monomer and the second monomer are soluble in the developer solution and in consideration of specific first and second monomers which may be used, some embodiments a ratio $R_M$ of the molar concentration of the second monomer to the molar concentration of the first monomer (for deriving the resist polymer) may in a range of about 0.1 to about 10. In other embodiments, $R_M$ may be in a range of about 0.5 to about 5. See Example 1, described infra, in which $R_M$ is 1.5 (i.e., 0.018/0.012).

The present invention is not limited to any specific method of synthesizing the resist polymer, and any method of synthesis known to a person of ordinary skill in the art may be utilized. For example, the resist polymer may be formed by free radical polymerization. Examples of other suitable techniques for cyclic olefin polymers and other polymers are disclosed in U.S. Pat. Nos. 5,468,819, 5,705,503, 5,843,624 and 6,048,664, the disclosures of which are incorporated herein by reference.

The negative resist compositions of the invention can be prepared by combining the resist polymer (2), the hydroxy-containing additive (1), and the radiation sensitive acid generator, and any other desired ingredients using conventional methods. The negative resist composition to be used in lithographic processes may have a significant amount of solvent.

The resist compositions of the invention are especially useful for lithographic processes used in the manufacture of integrated circuits on semiconductor substrates. The negative resist compositions are especially useful for lithographic processes using 193 nm or less (e.g., 157 nm) ultraviolet (UV) radiation. Where use of other radiation (e.g. x-ray, or e-beam) is desired, the compositions of the invention can be adjusted (if necessary) by the addition of an appropriate dye or sensitizer to the composition. The use of the resist compositions of the present invention in lithography for patterning substrates (e.g., semiconductor substrates) is described next.

Lithographic applications generally involve transfer of a pattern to a layer of material on the substrate (e.g., semiconductor substrate, ceramic substrate, organic substrate, etc.). The material layer of the substrate may be a semiconductor layer (e.g., silicon, germanium, etc.), a conductor layer (e.g., copper), a dielectric layer (e.g., silicon dioxide), or other material layer depending on the stage of the manufacture process and the desired material set for the end product. In some applications, an antireflective coating (ARC) is applied over the material layer before application of the resist layer. The ARC layer may be any conventional ARC which is compatible with the negative photoresists of the present invention.

The solvent-containing negative photoresist composition may be applied to the desired substrate using, inter alia, spin coating or other technique. The substrate with the resist coating may be heated (i.e., pre-exposure baked) to remove the solvent and improve the coherence of the resist layer. The thickness of the applied layer may be thin, subject to the thickness being substantially uniform and the resist layer being of sufficient thickness to withstand subsequent processing (e.g., reactive ion etching) to transfer the lithographic pattern to the underlying substrate material layer. The pre-exposure bake step may be preferably conducted for about 10 seconds to 15 minutes, more preferably about 15 seconds to one minute.

After solvent removal, the resist layer is then patternwise-exposed to the desired radiation (e.g. 193 nm or 157 nm ultraviolet radiation). Where scanning particle beams such as electron beam are used, patternwise exposure may be achieved by scanning the beam across the substrate and selectively applying the beam in the desired pattern. Where wavelike radiation forms such as 193 nm or 157 nm ultraviolet radiation are used, the patternwise exposure may be conducted through a mask which is placed over the resist layer. The mask is patterned such that first portions of the mask are transparent to the radiation and second portions of the mask are opaque to the radiation. Thus the radiation-exposed photoresist coating on the substrate has an exposure pattern that reflects the patterning of the mask. For 193 nm UV radiation, the total exposure energy is preferably about 100 millijoules/cm² or less, and more preferably about 50 millijoules/cm² or less (e.g. 15-30 millijoules/cm²).

After the desired patternwise exposure, the resist layer may be baked to further complete the acid-catalyzed reaction and to enhance the contrast of the exposed pattern. The post-exposure bake may be conducted at about 100-175° C., and more preferably at about 100-130° C. The post-exposure bake may be conducted for about 15 seconds to 5 minutes.

After post-exposure bake, the resist structure with the desired pattern is obtained by contacting the negative resist layer with the aqueous alkaline developer solution which selectively dissolves the areas of the negative resist which were not exposed to radiation. The resist compositions of the present invention can be developed for use with conventional 0.26N aqueous alkaline solutions. The resist compositions of the invention can also be developed using 0.14N or 0.21N or other aqueous alkaline solutions. The resulting resist structure on the substrate may be dried to remove any remaining developer. The resist compositions of the present invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., dielectric, conductor, or semiconductor) of the underlying substrate. The transfer may be achieved by reactive ion etching or some other etching technique (e.g., chemical etching). In the context of reactive ion etching, the etch resistance of the resist layer may be important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc., as might be used in the design of integrated circuit devices.

The processes for making these (ceramic, conductor, or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

FIGS. 1-6 illustrate the use of photolithography with a negative photoresist to pattern a substrate, in accordance with embodiments of the present invention.

Figure 1:
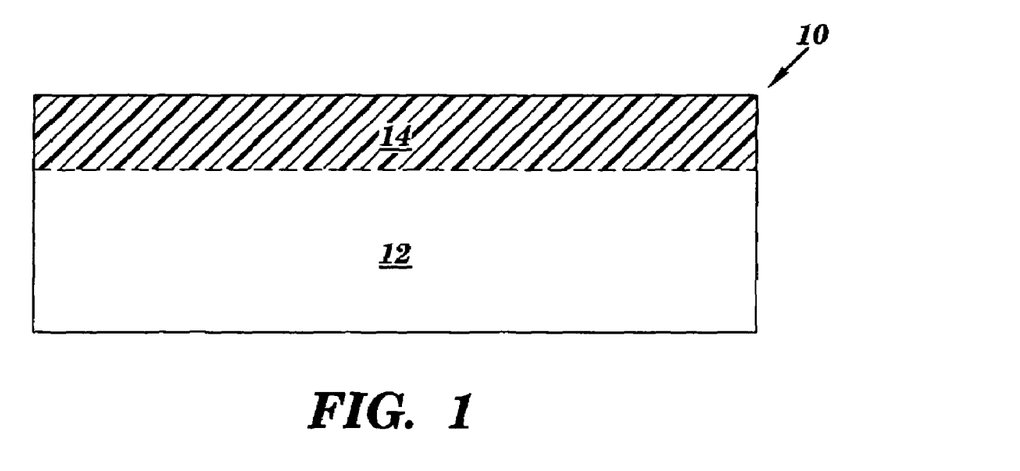
FIGS. 1-6 illustrate the use of photolithography with a negative photoresist to pattern a substrate, in accordance with embodiments of the present invention.

FIG. 1 depicts a substrate 10 comprising a material layer 14 (to be patterned) and a remaining layer 12.

Figure 2:
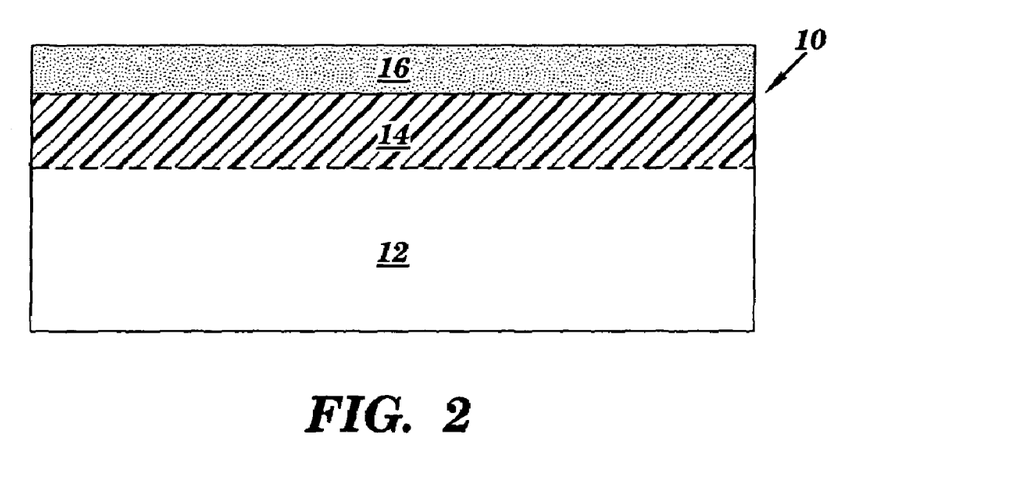

FIG. 2 depicts FIG. 1 after a photoresist layer 16 has been formed on the material layer 14. The photoresist layer 16 includes the negative photoresist composition of the present invention, comprising an acid generator, the hydroxy-containing additive (1), and the resist polymer (2). The negative photoresist composition is soluble in an aqueous base developer solution prior to being exposed to the imaging radiation discussed infra in conjunction with FIG. 3.

Figure 3:
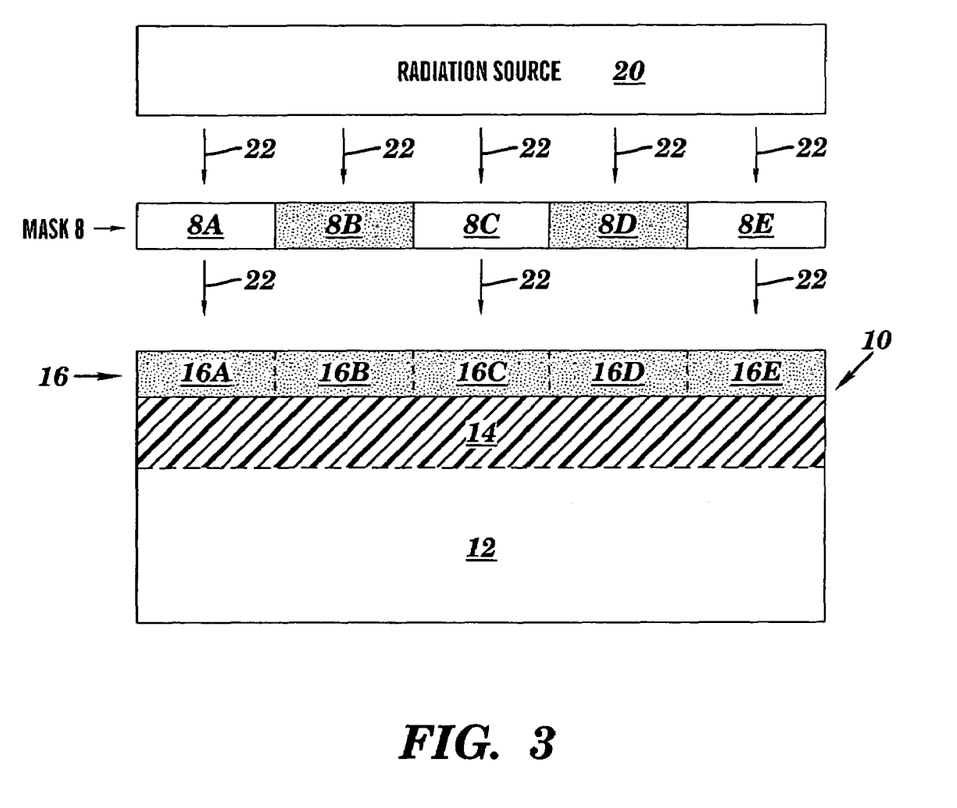

FIG. 3 depicts FIG. 2 with a radiation source 20 emitting imaging radiation 22 through transparent portions 8A, 8C, and 8E of a mask 8. The radiation 22 is characterized by a wavelength such as, inter alia, 193 nm or less (e.g., 157 nm). The radiation 22 does not pass through opaque portions 8B and 8D of the mask 8. The radiation 22 transmitted through the transparent portions 8A, 8C, and 8E of the mask 8 strikes those portions 16A, 16C, and 16E of the photoresist layer 16 which are directly beneath said transparent portions of the mask 8. The radiation 22 causes the acid generator in portions 16A, 16C, and 16E of the photoresist layer 16 to generate acid, which in turn causes the hydroxy-containing additive (1) to chemically react with the resist polymer (2) to generate a reaction product that is insoluble in the developer solution. Thus after the photoexposure to the radiation 22, the exposed portions 16A, 16C, and 16E of the photoresist layer 16 are insoluble in the developer solution, whereas the unexposed portions 16B and 16D of the photoresist layer 16 are soluble in the developer solution.

Figure 4:
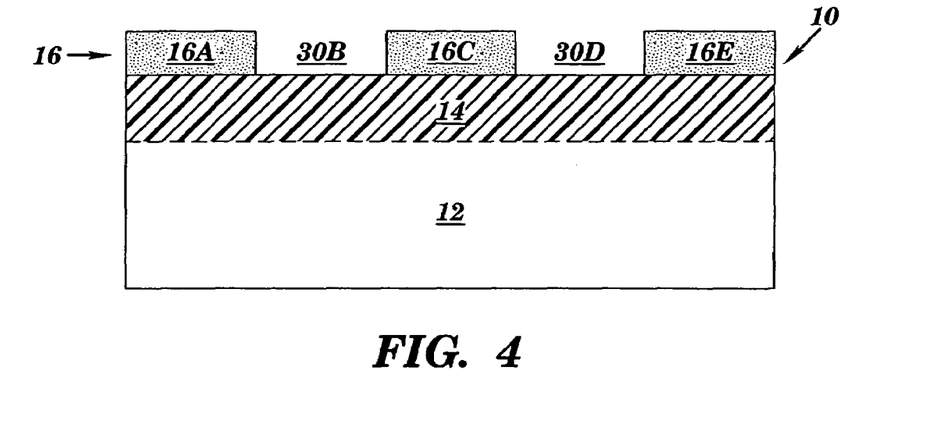

FIG. 4 depicts FIG. 3 after the developer solution been applied to the photoresist layer 16 and has thus developed away the unexposed portions 16B and 16D of the photoresist layer 16 to generate voids 30B and 30D, respectively, in the photoresist layer 16.

Figure 5:
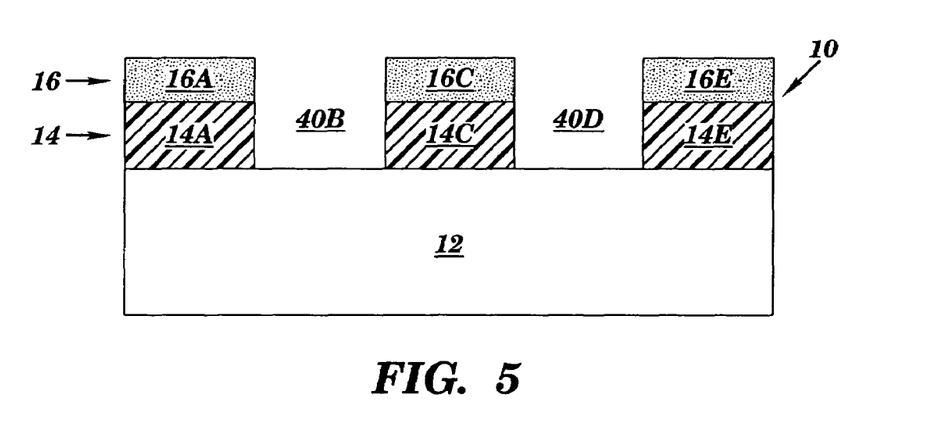

FIG. 5 depicts FIG. 4 after material layer 14 has been etched, such as by reactive ion etching or chemical etching, through the voids 30B and 30D to form blind vias 40B and 40D, respectively, in the material layer 14. The unetched portions 14A, 14C, and 14E of the material layer 14, together with the blind vias 40B and 40D in the material layer 14, form a pattern in the material layer 14. Said pattern in the material layer 14 reflects the pattern of transparent and opaque portions of the mask 8 of FIG. 3.

Figure 6:
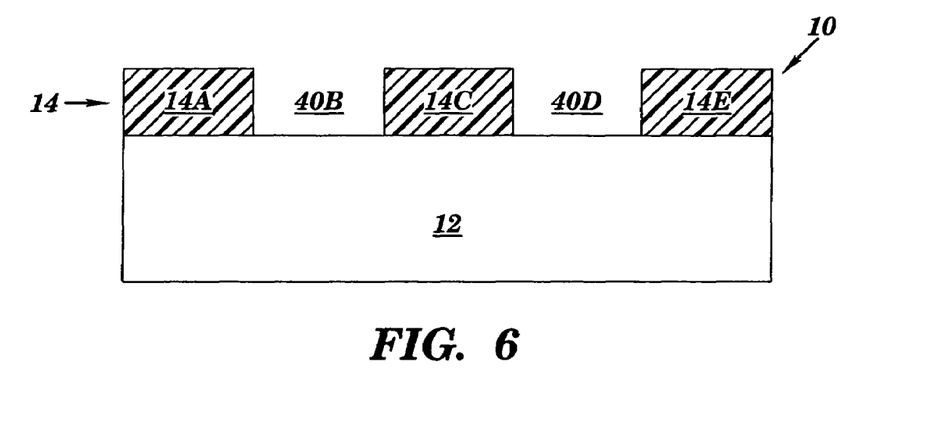

FIG. 6 depicts FIG. 5 after the photoresist layer 16 has been removed.

EXAMPLE 1

Chemical Reaction of Polymer and Additive

The following chemical reaction is an example of how the resist polymer XXXXVI (derived from the structure XV, namely N-(iso-butoxymethyl) methacrylamide) reacts with the hydroxy-containing additive V (i.e., 2-hydroxy adamantane) in the presence of H+ (from acid) and heat to generate the reaction product XXXXVII which is insoluble in the developer solution due to the hydrophobic (adamantyl) group Q supplied by the hydroxy-containing additive V. Generally, heat input may be required, and the heat may come from the post-exposure bake stage.

(XXXXVI)  (V)  (XXXXVII)

EXAMPLE 2

Synthesis of Resist Polymer (XV-co-XXXVI)

A resist polymer (XV-co-XXXVI) of the present invention was synthesized from the first monomer XV (N-(iso-butoxymethyl) methacrylamide) and the second monomer XXXVI (1,1,1-trifluoro-2-trifluoromethyl-2-hydroxy-4-pentyl methacrylate). A solution was provided, wherein the solution comprised 2.05 g (0.012 mole) of first monomer XV, 5.29 g (0.018 mole) of second monomer XXXVI, and 0.081 g (0.0004 mole) of dodecanethiol, dissolved in 22 grams of solvent 2-butanone. A quantity of 0.2 g (0.0012 mole) of initiator 2,2'-azobisisobutyronitrile (AIBN) was added to the solution. Other suitable initiators that could be alternatively used include benzoyl peroxide (BPO), methyl ethyl ketone peroxide (MEKP), dicumyl peroxide, acetyl peroxide, lauryl peroxide, t-butyl paracetate, cumyl peroxide, t-butyl peroxide, t-butyl hyperperoxide, etc. The solution was deoxygenated by bubbling dry $N_2$ gas through the solution for 0.5 hr. Then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 3

Lithographic Evaluation Using 193 nm Exposure Tool

For the purpose of evaluative lithographic experiments at 193 nm, a negative photoresist formulation containing the resist polymer (XV-co-XXXVI) of Example 2 was prepared by combining the materials set forth below, expressed in terms of weight percent.

| | |
|---|---|
| Propylene glycol monomethyl ether acetate | 89.77 |
| 1-Admantanemethanol | 2.26 |
| Polymer (XV-co-XXXVI) | 7.52 |
| 4-(1-Butoxynaphthyl)tetrahydrothiophenium perfluorobutanesulfonate | 0.45 |

In the preceding list of materials, the propylene glycol monomethyl ether acetate is the solvent, the 1-admantanemethanol is the hydroxyl-containing additive, the XV-co-XXXVI is the resist polymer, and the 4-(1-butoxynaphthyl)tetrahydrothiophenium perfluorobutanesulfonate is the acid generator.

The prepared photoresist formulation was spin-coated for 30 seconds onto an antireflective material (AR40, Shipley Company) layer applied on silicon wafers. The photoresist layer was soft-baked at 115° C. for 60 seconds on a vacuum hot plate to produce a film thickness of about 0.24 μm. The wafers were then exposed to 193 nm radiation (ASML scanner, 0.75 NA). The exposure pattern was an array of lines and spaces of varying dimensions with the smallest dimension being 0.09 μm. The exposed wafers were post-exposure baked on a vacuum hot plate at 115° C. for 90 seconds. The wafers were then puddle developed using 0.263 N TMAH developer solution for 60 seconds. The resulting patterns of the photoresist imaging layer were then examined by scanning electron microscopy (SEM). Patterns of line/space pairs of 140 nm (i.e., 0.14 μm) and above were well resolved.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A negative photoresist composition, comprising:
   (a) a radiation sensitive acid generator;
   (b) a hydroxy-containing additive having the structure:

Q—OH wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons;
   (c) a resist polymer comprising a repeating first monomer unit derived from a first monomer comprising the structure:

(d) at least one of a solvent and a quencher,
   wherein M is a polymerizable backbone moiety,
   wherein Z is a linking moiety comprising one of —C(O)O—, —C(O)—, —OC(O)—, —O—C(O)—C(O)—O—,
   wherein Y is one of an alkylene group, an arylene group, a semi- or perfluorinated alkylene group, and a semi- or perfluorinated arylene group,
   wherein p is 0 or 1,
   wherein q is 0 or 1, wherein R1, R2, R3, and R4 independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, wherein the resist polymer is adapted to chemically react with the additive in the presence of the acid in a non-crosslinking chemistry to generate a product that is insoluble in the developer solution, and wherein the solvent comprises at least one of an ether, a glycol ether, an aromatic hydrocarbon, a ketone, and an ester.

2. The negative photoresist composition of claim 1, wherein the hydroxy-containing additive has a primary alcohol structure.

3. A negative photoresist composition, comprising:
(a) a radiation sensitive acid generator;
(b) a hydroxy-containing additive having the structure:

wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene group, a semi- or perfluorinated alkylene group, and a semi- or perfluorinated arylene group, wherein p is 0 or 1, wherein q is 0 or 1, wherein R1, R2, R3, and R4 independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, wherein the resist polymer is adapted to chemically react with the additive in the presence of the acid in a non-crosslinking chemistry to generate a product that is insoluble in the developer solution, wherein the hydroxy-containing additive has a primary alcohol structure, and wherein the primary alcohol structure is a 1-adamantanemethanol, a 1-adamantaneethanol, or a derivative thereof.

4. The negative photoresist composition of claim 1, wherein Q comprises one or more cyclic structures.

5. The negative photoresist composition of claim 1, wherein Q comprises one or more alicyclic structures.

6. The negative photoresist composition of claim 1, wherein the polymerizable backbone moiety, M, includes one of a first structure and a second structure, wherein the first structure is:

wherein $R_5$ represents one of hydrogen, an alkyl group of 1 to 20 carbons, a semi- or perfluorinated alkyl group of 1 to 20 carbons, and CN, and wherein the second structure is:

wherein t is an integer from 0 to 3.

7. The negative photoresist composition of claim 1, wherein the resist polymer further comprises a second monomer unit derived from a second monomer having an aqueous base soluble moiety.

8. The composition of claim 7, wherein the second monomer comprises at least one of a fluorosulfonamide, a carboxylic acid, or a fluoroalcohol moiety.

9. The negative photoresist composition of claim 1, wherein the radiation sensitive acid generator comprises at least one of an onium salt, a succinimide derivative, a diazo compound, and a nitrobenzyl compound.

10. The negative photoresist composition of claim 9, wherein the acid generator comprises at least one of 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide.

11. A negative photoresist composition, comprising:
(a) a radiation sensitive acid generator;
(b) a hydroxy-containing additive having the structure:

wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene group, a semi- or perfluorinated alkylene group, and a semi- or perfluorinated arylene group, wherein p is 0 or 1, wherein q is 0 or 1, wherein R1, R2, R3, and R4 independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, wherein the resist polymer is adapted to chemically react with the additive in the presence of the acid in a non-crosslinking chemistry to generate a product that is insoluble in the developer solution, and wherein p=0 and q=1, p=1 and q=0, or p=1 and q=1.

12. A negative photoresist composition, comprising:

(a) a radiation sensitive acid generator;

(b) a hydroxy-containing additive having the structure:

Q—OH wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene group, a semi- or perfluorinated alkylene group, and a semi- or perfluorinated arylene group, wherein p is 0 or 1, wherein q is 0 or 1, wherein R1, R2, R3, and R4 independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, wherein the resist polymer is adapted to chemically react with the additive in the presence of the acid in a non-crosslinking chemistry to generate a product that is insoluble in the developer solution, and wherein the hydroxy-containing additive is selected from the group consisting of (I)

(II)

(III)

-continued

(IV)

(V)

(VI)

(X)

(XI)

(XII)

(XIII) , and (XIV) .

13. The negative photoresist composition of claim 1, wherein the solvent comprises at least one of propylene glycol monomethyl ether acetate, ethyl lactat, γ-butyrolactone, and cyclohexanone.

14. The negative photoresist composition of claim 1, wherein the quencher comprises at least one of an aromatic amine, an aliphatic amine, and a tetraalkyl ammonium hydroxide.

15. The negative photoresist composition of claim 1, wherein:
the weight of the polymer is about 1% to about 30% of the weight of the composition;
the weight of the solvent is about 70% to about 99% of the weight of the composition;
the weight of the hydroxy-containing additive is about 5% to about 70% of the weight of the polymer; and
the weight of the acid generator is about 0.5% to about 20% of the weight of the polymer.

16. The negative photoresist composition of claim 15, further comprising a quencher, wherein the weight of the quencher is about 0.1% to about 1.0 wt. % of the weight of the polymer.

17. The negative photoresist composition of claim 1, wherein:
the weight of the polymer is about 5% to about 15% of the weight of the composition;
the weight of the solvent is about 85% to about 95% of the weight of the composition;
the weight of the hydroxy-containing additive is about 10% to about 50% of the weight of the polymer; and
the weight of the acid generator is about 0.5% to about 10% of the weight of the polymer.

18. A method of patterning a substrate, said method comprising the steps of:
(A) applying a negative photoresist composition to the substrate to form a resist layer on a material layer of the substrate and in direct mechanical contact with the material layer, said composition comprising:
(a) a radiation sensitive acid generator;
(b) a hydroxy-containing additive having the structure:

Q—OH wherein Q is one of an alkyl group with 4 to 50 carbons, an aryl group with 4 to 50 carbons, a semi- or perfluorinated alkyl group with 4 to 50 carbons, a semi- or perfluorinated aryl group with 4 to 50 carbons, an alkaryl group with 4 to 50 carbons, an aralkyl group with 4 to 50 carbons, a semi- or perfluorinated alkaryl group with 4 to 50 carbons, and a semi- or perfluorinated aralkyl group with 4 to 50 carbons; and (c) a resist polymer comprising a repeating first monomer unit derived from a first monomer comprising the structure:

wherein M is a polymerizable backbone moiety,
wherein Z is a linking moiety comprising one of —C(O)O—, —C(O)—, —OC(O)—, —O—C(O)—C(O)—O—,
wherein Y is one of an alkylene group, an arylene group, a semi- or perfluorinated alkylene group, and a semi- or perfluorinated arylene group, wherein p is 0 or 1, wherein q is 0 or 1, wherein R1, R2, R3, and R4 independently comprise one of hydrogen and a straight or branched alkyl group with 1 to 6 carbons, and wherein the resist polymer is soluble in an aqueous alkaline developer solution;

(B) selectively exposing a first portion of the resist layer to imaging radiation characterized by a wavelength such that a second portion of the resist layer is not exposed to the radiation, wherein the first and second portions of the resist layer form a pattern in the resist layer, wherein the radiation causes the acid generator to generate acid in the first portion of the resist layer in a non-crosslinking chemistry, wherein the acid facilitates a chemical reaction between the resist polymer and the additive in the first portion of the resist layer such to generate a reaction product in the first portion of the resist layer, and wherein the reaction product is insoluble in the developer solution; and (C) developing away the second portion of the resist layer by contacting the resist layer with the developer solution such that the second portion of the resist layer is replaced by voids in the resist layer.

19. The method of claim 18, further comprising the steps of:

(D) transferring the pattern in the resist layer to the material layer, by etching into the material layer through the voids in the resist layer; and (E) after step (D), removing the resist layer.

20. The method of claim 18, wherein the wavelength is less than or equal to about 193 nm.

21. The method of claim 18, wherein the wavelength is about 157 nm.

22. The method of claim 18, wherein the wavelength is about 193 nm.

23. The method of claim 18, wherein the substrate comprises a semiconductor wafer.

24. The method of claim 18, wherein the hydroxy-containing additive has a primary alcohol structure.

25. The method of claim 24, wherein the primary alcohol structure is a 1-adamantanemethanol, a 1-adamantaneethanol, or a derivative thereof.

26. The method of claim 18, wherein Q comprises one or more cyclic structures.

27. The method of claim 18, wherein Q comprises one or more alicyclic structures.

28. The method of claim 18, wherein the polymerizable backbone moiety, M, includes a first structure and a second structure, wherein the first structure is:

wherein R5 represents one of hydrogen, an alkyl group of 1 to 20 carbons, a semi- or perfluorinated alkyl group of 1 to 20 carbons, and CN, and wherein the second structure is:

wherein t is an integer from 0 to 3.

29. The method of claim 18, wherein the resist polymer further comprises at least one second monomer unit derived from a second monomer having an aqueous base soluble moiety.

30. The method of claim 29, wherein the second monomer comprises at least one of a fluorosulfonamide, a carboxylic acid, or a fluoroalcohol moiety.

* * * * *